(12) United States Patent
Yeh et al.

(10) Patent No.: US 10,872,822 B2
(45) Date of Patent: *Dec. 22, 2020

(54) METHOD FOR MANUFACTURING SEMICONDUCTOR DEVICES

(71) Applicant: TAIWAN SEMICONDUCTOR MANUFACTURING CO., LTD., Hsinchu (TW)

(72) Inventors: Ling-Yen Yeh, Hsinchu (TW); Carlos H. Diaz, Mountain View, CA (US); Wilman Tsai, Saratoga, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/725,693

(22) Filed: Dec. 23, 2019

(65) Prior Publication Data
US 2020/0135577 A1 Apr. 30, 2020

Related U.S. Application Data

(63) Continuation of application No. 15/884,026, filed on Jan. 30, 2018, now Pat. No. 10,515,857.

(Continued)

(51) Int. Cl.
*H01L 21/8234* (2006.01)
*H01L 21/02* (2006.01)
(Continued)

(52) U.S. Cl.
CPC ........... *H01L 21/823462* (2013.01); *H01L 21/02181* (2013.01); *H01L 21/02356* (2013.01);
(Continued)

(58) Field of Classification Search
CPC ....... H01L 21/823462; H01L 29/66545; H01L 21/02356; H01L 21/02181; H01L 21/823431; H01L 21/324
(Continued)

(56) References Cited

U.S. PATENT DOCUMENTS 10,515,857 B2 * 12/2019 Yeh ................. H01L 21/823431
2014/0284719 A1 * 9/2014 Khakifirooz .......... H01L 21/845
257/351

(Continued)

OTHER PUBLICATIONS

Manfrinato, Vitor R., et al., "Resolution Limits of Electron-Beam Lithograph Toward the Atomic Scale", Nano Letters 2013, 13, pp. 1555-1558, Mar. 2013.

(Continued)

*Primary Examiner* — Vu A Vu
(74) *Attorney, Agent, or Firm* — McDermott Will & Emery LLP

(57) ABSTRACT

In a method of manufacturing a circuit including a MOSFET disposed in a MOSFET region and a negative capacitance FET (NCFET) disposed in a NCFET region, a dielectric layer is formed over a channel layer in the MOSFET region and the NCFET region. A first metallic layer is formed over the dielectric layer in the MOSFET region and the NCFET region. After the first metallic layer is formed, an annealing operation is performed only in the NCFET region. After the annealing operation, the first metallic layer is removed from the MOSFET region and the NCFET region. The annealing operation includes irradiating the first metallic layer and the dielectric layer in the NCFET region with an energy beam.

20 Claims, 14 Drawing Sheets

Related U.S. Application Data

(60) Provisional application No. 62/564,780, filed on Sep. 28, 2017.

(51) Int. Cl.
*H01L 21/324* (2006.01)
*H01L 29/66* (2006.01)
*H01L 21/28* (2006.01)
*H01L 29/78* (2006.01)

(52) U.S. Cl.
CPC .... *H01L 21/324* (2013.01); *H01L 21/823431* (2013.01); *H01L 29/40111* (2019.08); *H01L 29/6684* (2013.01); *H01L 29/66545* (2013.01); *H01L 29/78391* (2014.09); *H01L 29/785* (2013.01)

(58) Field of Classification Search
USPC ........................................................ 438/275
See application file for complete search history.

(56) References Cited

U.S. PATENT DOCUMENTS

| | | |
|---|---|---|
| 2015/0287802 A1 | 10/2015 | Lee |
| 2016/0086849 A1 | 3/2016 | Gluschenkov et al. |
| 2019/0019875 A1 | 1/2019 | Tsai et al. |

OTHER PUBLICATIONS

Sidorkin, Vadim, et al., "Sub-10-nm Nanolithography with a Scanning Beam", J. Vac. Sci. Technol. B27(4), pp. L18-L20, Jul./Aug. 2009.

Kamins, T.I., et al., "Pulsed-Electron-Beam Annealing of Polycrystalline-Silicon Films", Applied Physics Letters, 35(3), pp. 282-285, Aug. 1979.

Non-Final Office Action, U.S. Appl. No. 15/884,026 dated Mar. 8, 2019.

Final Office Action, U.S. Appl. No. 15/884,026 dated Jul. 5, 2019.

Notice of Allowance, U.S. Appl. No. 15/884,026 dated Sep. 25, 2019.

* cited by examiner

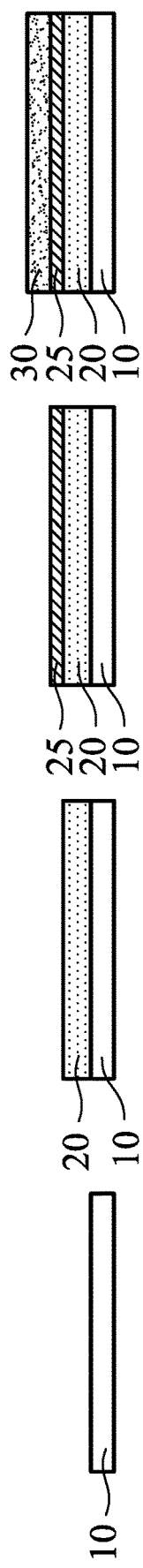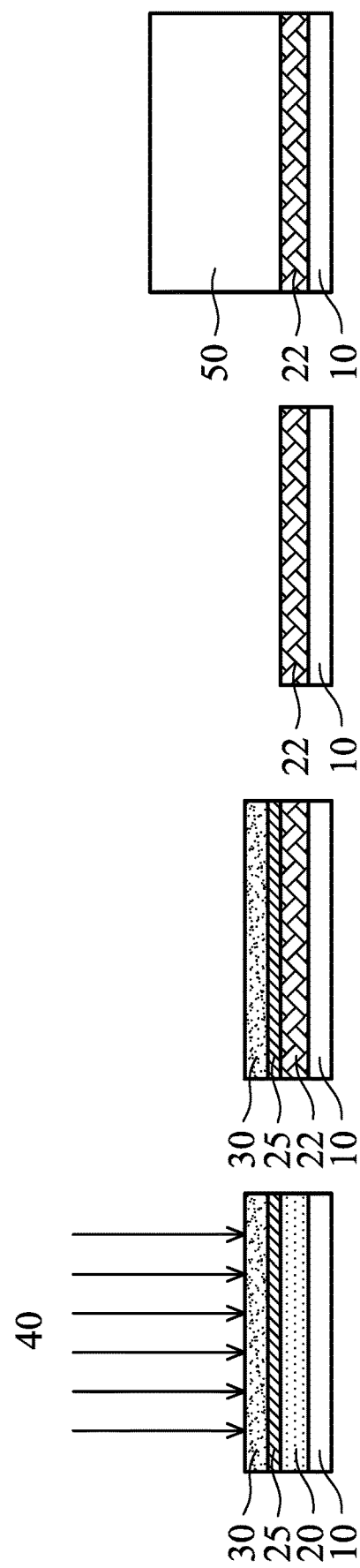

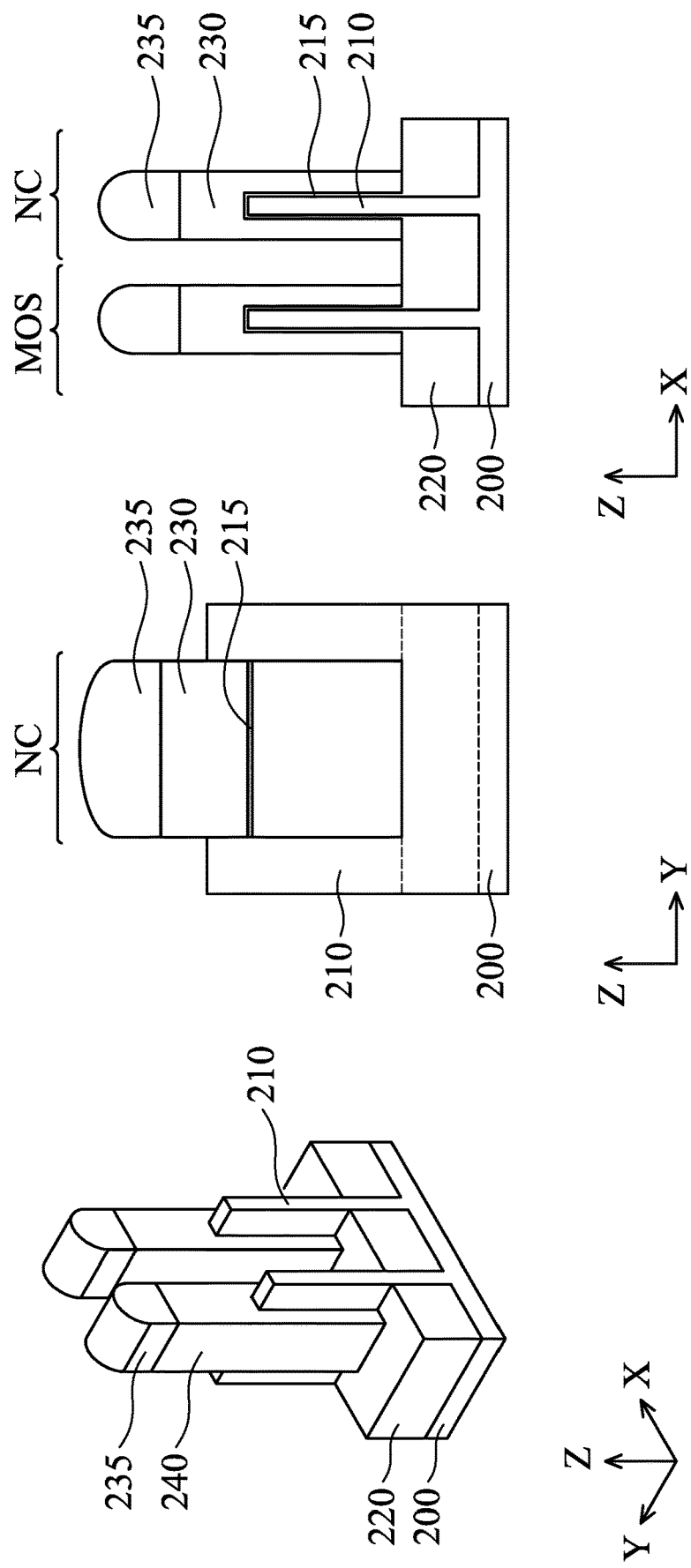

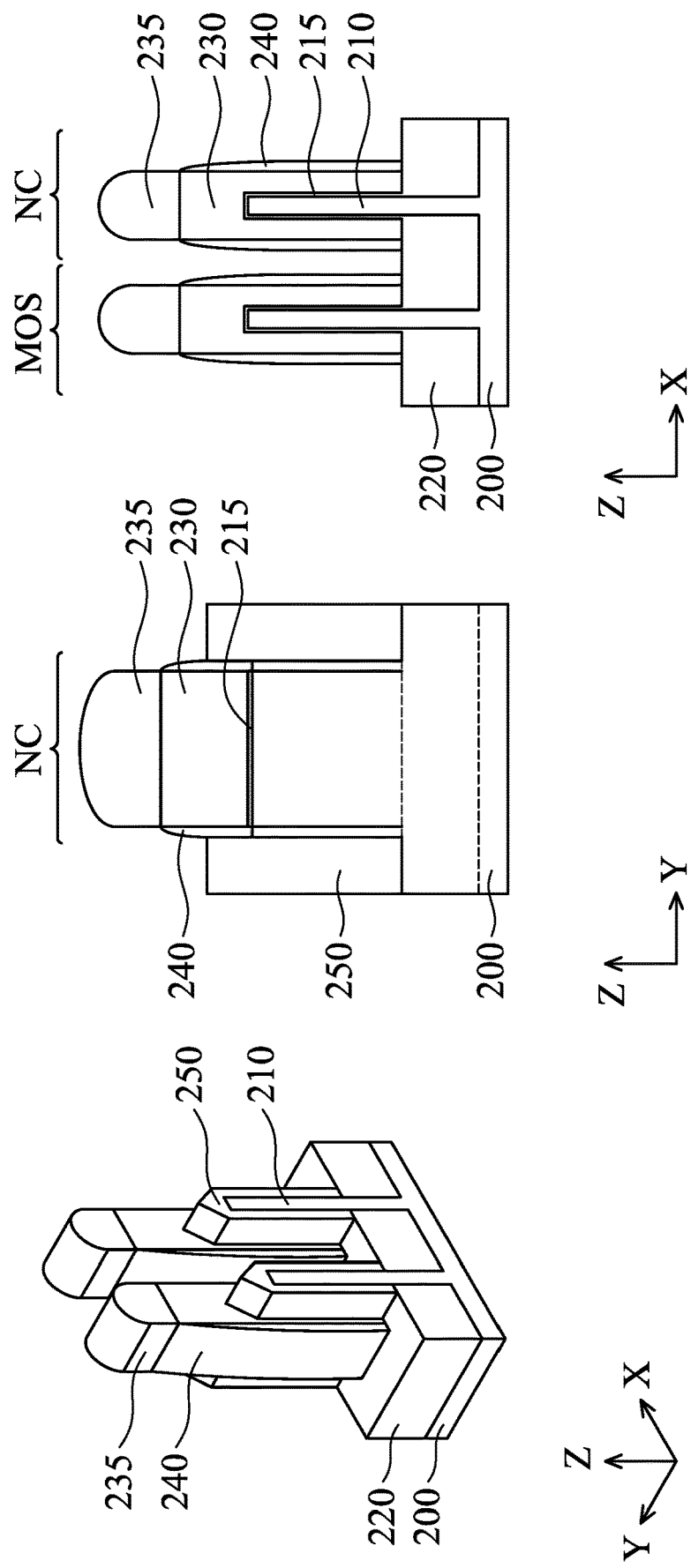

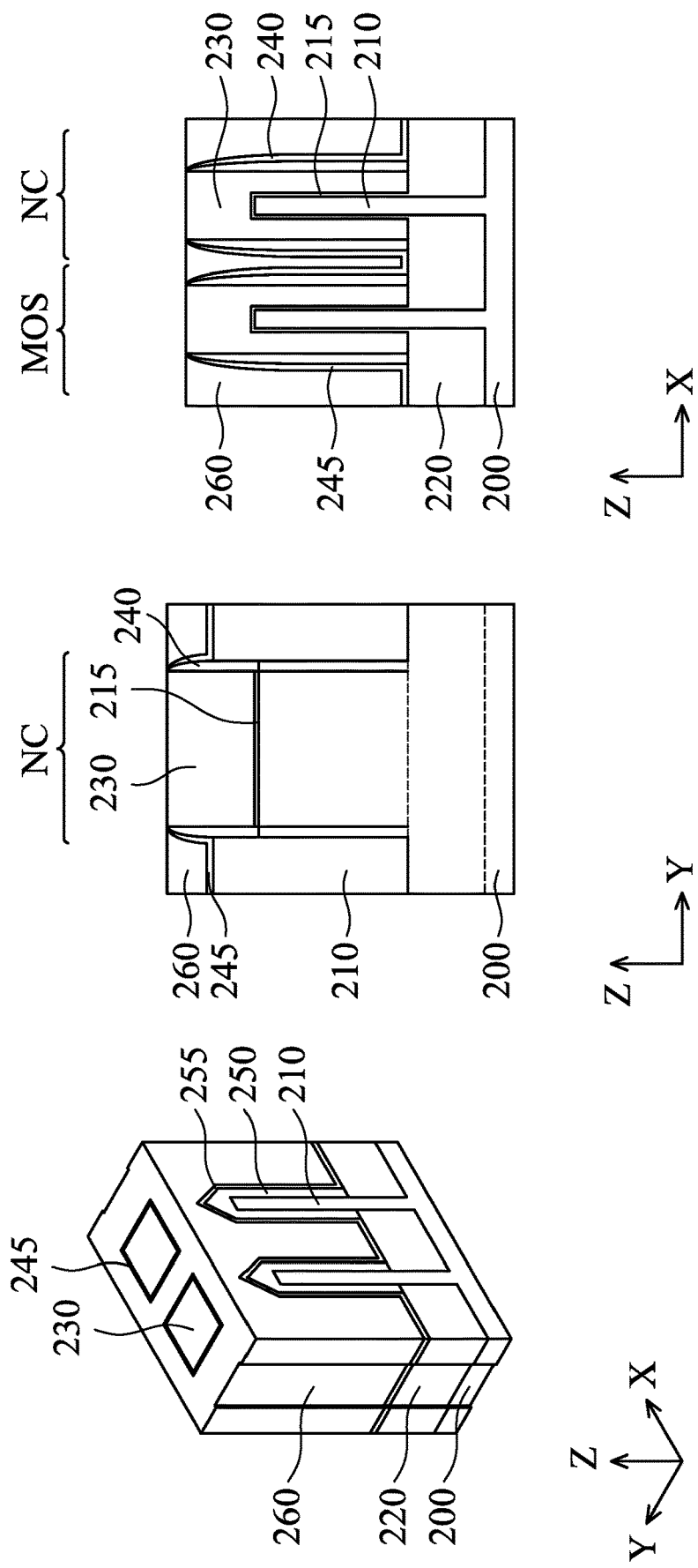

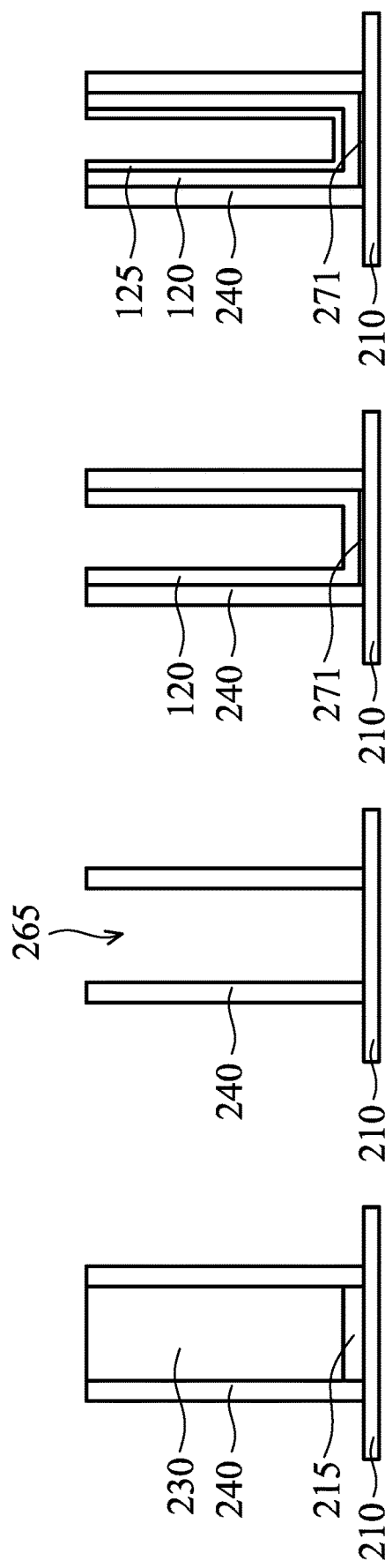

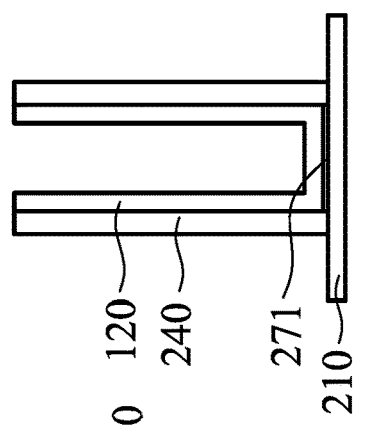
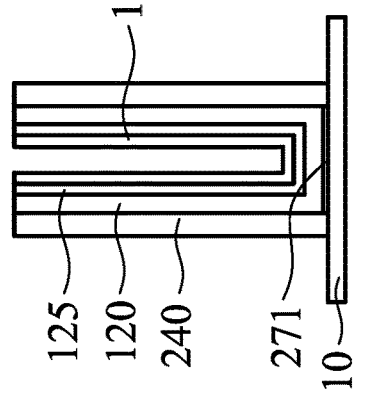
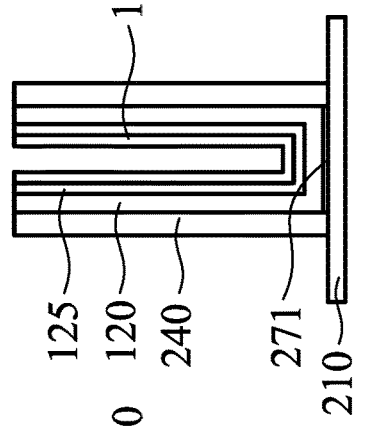
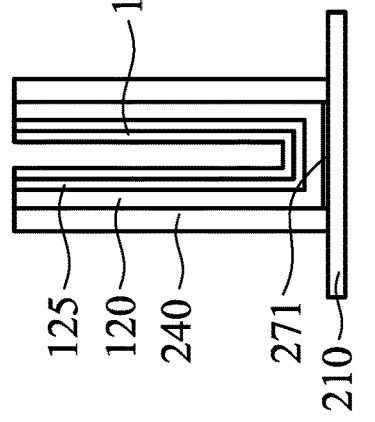

METHOD FOR MANUFACTURING SEMICONDUCTOR DEVICES

PRIORITY CLAIM AND CROSS-REFERENCE

This application is Continuation of U.S. patent application Ser. No. 15/884,026 filed on Jan. 30, 2018, entitled "METHOD FOR MANUFACTURING SEMICONDUCTOR DEVICES", which claims priority to U.S. Provisional Application No. 62/564,780 filed Sep. 28, 2017, entitled "METHOD FOR MANUFACTURING SEMICONDUCTOR DEVICES," the entire disclosure of the two applications are incorporated herein by reference.

BACKGROUND

The subthreshold swing is a feature of a transistor's current-voltage characteristic. In the subthreshold region the drain current behavior is similar to the exponentially increasing current of a forward biased diode. A plot of logarithmic drain current versus gate voltage with drain, source, and bulk voltages fixed will exhibit approximately logarithmic linear behavior in this metal-oxide-semiconductor (MOS) FET operating region. To improve the subthreshold properties, a negative capacitance field effect transistor (NCFET) using a ferroelectric material has been proposed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 2C, 2D, 2E, 2F, 2G and 2H show various stages of manufacturing operations for a negative capacitance structure in accordance with an embodiment of the present disclosure.

FIGS. 9A, 9B and 9C show one of the various stages of manufacturing operations for an NCFET in accordance with an embodiment of the present disclosure.

FIGS. 10A, 10B and 10C show one of the various stages of manufacturing operations for an NCFET in accordance with an embodiment of the present disclosure.

FIGS. 11A, 11B and 11C show one of the various stages of manufacturing operations for an NCFET in accordance with an embodiment of the present disclosure.

FIGS. 12A, 12B, 12C and 12D show various stages of manufacturing operations for an NCFET in accordance with an embodiment of the present disclosure.

FIGS. 13A, 13B, 13C and 13D show various stages of manufacturing operations for an NCFET in accordance with an embodiment of the present disclosure.

FIGS. 14A, 14B, 14C and 14D show various stages of manufacturing operations for a normal FET in accordance with an embodiment of the present disclosure.

DETAILED DESCRIPTION

Figure 1A:
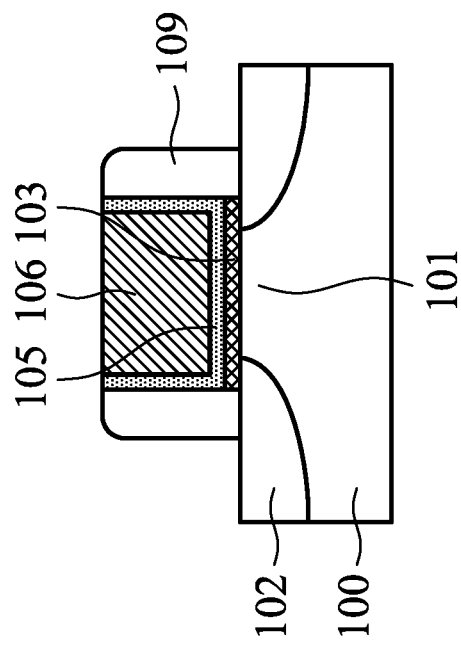
FIGS. 1A, 1B and 1C shows cross sectional views of metal-insulator-semiconductor (MIS) FET-type NCFETs.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

Reduction of operating voltage is one of the issues in advanced ultra-large scale integrated circuits (ULSI). Reduction of power consumption and suppression of heat generation can be achieved by the reduction of the operating voltage. It is estimated that the operating voltage should be decreased from about 0.8 V in the 14 nm technology node to about 0.5 V in the 3 nm technology node. A subthreshold swing (S.S.) having a steep slope (e.g., <60 mV/dec.) is required, and it is also required to have a sufficient high on-state current and a high Ion/Ioff ratio at such a low operating voltage. Among the options in the transistors having a steep S.S. slope, such as tunneling transistors, spin-based transistors, mechanical switch, negative capacitance field effect transistors (NCFETs), etc., a NCFET may be the most promising device due to its superior compatibility to widely used manufacturing processes for complementary metal-oxide-semiconductor field effect transistors (CMOSFETs).

The structure of NCFETs is similar to that in typical MOSFETs. In one embodiment, the NCFET is constructed by inserting a ferroelectric thin film between the gate dielectric and the gate electrode to form a metal-oxide-semiconductor capacitance (MOS CAP) in a MOSFET. Its operation mechanism is similar to that of MOSFETs, but the voltage across the gate dielectric can be higher than the applied gate voltage when it is operated in the negative capacitance region. The inserted ferroelectric layer can be a hafnium oxide based material with various doping elements, such as Si, Al, Gd, Mg, and/or Zr. Hafnium oxide ($HfO_2$) is now commonly used as a high-k gate dielectric layer in typical MOSFETs. As a result, NCFET using hafnium oxide may be integrated into CMOSFET circuits, as, for example, a booster transistor in the circuit.

The ferroelectricity in the ferroelectric layer of NCFETs originates from the remnant polarization. The remnant polarization is induced by the generation of dipoles. Such dipoles exist in the ferroelectric domains, phases or polymorphs in a material. In one embodiment, $HfO_2$ is the ferroelectric material and the ferroelectric phase of $HfO_2$ originates from the orthorhombic crystal phase. The single crystal $HfO_2$ in the orthorhombic phase is very difficult to fabricate because it generally requires a very high pressure, such as in the Giga-pascal range. Thus, ferroelectric $HfO_2$ is usually polycrystalline and a mixture of non-ferroelectric phases, such as monoclinic phase, tetragonal phase and/or cubic phase, and the ferroelectric phase, such as orthorhombic phase. The ferroelectricity of $HfO_2$ is usually generated by heating the doped $HfO_2$ in an appropriate thermal process. The doped amorphous $HfO_2$ is transformed by the thermal process into a crystalline structure with ferroelectric phases due to the strain generated in the thin films during the thermal process.

It is known that the grain boundary can be a leakage path of charged carriers when a certain voltage is applied between the gate electrode and the substrate in normal MOSFETs. Furthermore, in NCFETs, the effective voltage applied across the dielectric layer underneath the ferroelectric can be larger than the applied gate voltage to the gate electrode, and thus the leakage current may further be increased. Such an increase of the leakage current will largely increase the standby power if the transistors in a circuit are all made of NCFETs, even though NCFETs have the steep slope S.S. property.

In addition, the required thickness of the gate stack (e.g., a gate dielectric layer and a gate electrode layer) in NCFETs is usually thicker than that in normal MOSFETs due to the ferroelectric layer, and in a metal-insulator-metal (MIM) NCFET, an internal gate electrode is inserted between the ferroelectric layer and a non-ferroelectric layer in the gate stack. Work function adjustment metals above the ferroelectric layer are also required to adjust the work function of the transistors. When the transistors are fin field effect transistors (FinFETs), the formation of the work function adjustment metals would be even more difficult in a trench formed by a replacement gate (RPG) process due to an increase of the thickness of the gate stack in NCFETs. Thus, it is required to reduce the aspect ratio of the trench for NCFETs and this would further make it difficult to reduce the density of the transistors in a unit area.

These issues can be resolved if only a limited number of NCFETs are embedded as key transistors in a circuit. The process integration of the embedded NCFETs is thus an important issue to provide the potential benefits introduced by NCFETs.

To manufacture a limited number of NCFETs in a CMOS circuit, the ferroelectric layer is deposited and is partially removed in certain areas by a patterning process. The patterning process usually includes a photolithographic process and an etching process. The photolithographic process is used to mainly create the patterns where photo resist is coated on the NCFET area and is not coated on the normal MOSFET area. This is usually achieved by the projection lithography using steppers or scanners with the various light sources and light wavelengths. The ferroelectric layer in the normal MOSFET area is removed by an etching process. A gate dielectric layer is then formed and a second patterning is required remove the gate dielectric layer on the NCFET area. The etching process has to be selective so that the etching process can remove the gate dielectric layer (e.g., un-doped amorphous $HfO_2$) but stop at the ferroelectric doped $HfO_2$ in the second patterning. In this way, the gate dielectric layer is formed in the MOSFET area and the ferroelectric layer is formed in the NCFET area. In this process, however, at least two patterning process sequences are required.

In another method, an ion implantation operation is used to dope the amorphous $HfO_2$ only in the NCFET area. A patterning process is required to create the patterns where photo resist is coated on the MOSFET area and is not coated on the NCFET area. The concentration profile of the implanted ions is usually a Gaussian-like distribution with a certain projection range. It is known that the generation of the ferroelectric phase in $HfO_2$ is strongly dependent on the concentration of the doped species, and the non-uniform Gaussian-like distribution in the ion implantation may not be the most appropriate method in a fine circuit manufacturing.

In this disclosure, a novel method of manufacturing a semiconductor integrated circuit with embedded NCFETs is disclosed, in which no additional resist masks and lithography process are required to form the NCFETs in the CMOS circuit.

In some embodiments of the present disclosure, doping elements (species) are introduced to an amorphous $HfO_2$ selectively, and the ferroelectric phase can only be generated in the doped $HfO_2$. Thus, the $HfO_2$ with the ferroelectric property can be fabricated in the selective areas. In this way, NCFETs with ferroelectric $HfO_2$ can be embedded with normal MOSFET with dielectric $HfO_2$ in a CMOS circuit. Furthermore, no masks and patterning processes are required in the selective doping processes. The method allows the fabrication of elaborating three-dimensional polycrystalline features as small as about 1 to about 2 nm.

In some embodiments, monolayer doping is used to introduce the required species (dopants) into the amorphous $HfO_2$. Monolayer doping (MLD) includes two operations: (1) forming a functionalization layer on the surface of the amorphous $HfO_2$ with a dopant-containing molecule; and (2) a thin capping film, such as $SiO_2$, is formed on the surface of the functionalization layer to prevent out-diffusion in the subsequent operations. In certain embodiments, operation (2) is not performed. The MLD further includes (3) subsequent diffusion of the surface-bound, chemisorbed dopant atoms into the amorphous $HfO_2$ by an appropriate thermal operation.

The functionalization step of the surface of the amorphous $HfO_2$ includes a thermally initiated hydrosilylation reaction between a hydrogen-passivated surface and a labile C=C site on the dopant-containing molecule, in some embodiments. The functionalization and film forming in operations (1) and (2) can be realized by atomic layer deposition (ALD), chemical vapor deposition (CVD) or any other suitable film formation method. The dopants can be Zr, La, Gd, Si, Al, and/or Mg, or any other suitable elements.

Further, an annealing process is performed to modify the doped amorphous $HfO_2$ dielectric to have a ferroelectric property caused by orthorhombic phases of $HfO_2$ by the incorporation of the dopants into the lattice structure of $HfO_2$. In some embodiments of the present disclosure, the annealing is performed by introducing energetic particles or energetic waves, such as electron beam, ion beam (helium, neon, argon etc.), molecular beam, laser beam, and/or neutral beam, to selectively heat the desired portion in the wafer (substrate). The dimension of the beam spot can be less than about 1 nm in some embodiments, and the beam can be swept precisely along the three dimensional geometry of the underlying structure formed on the wafer. As a result, the amorphous $HfO_2$ to be used for MOSFETs can be selectively transformed into the ferroelectric $HfO_2$ for NCFETs by the selective annealing process with nanometer precision.

Figure 1B:
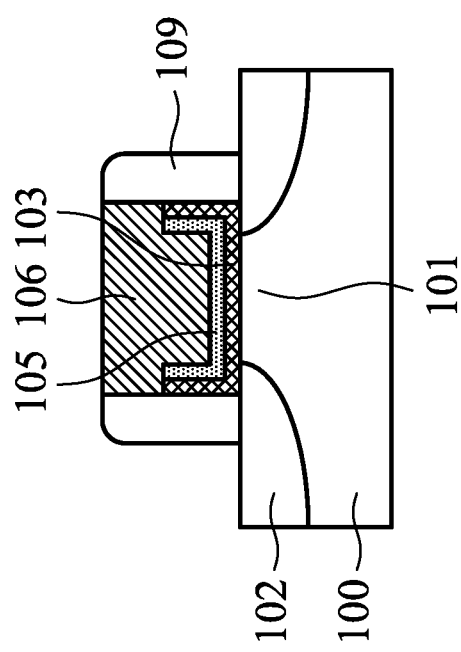
Figure 1C:
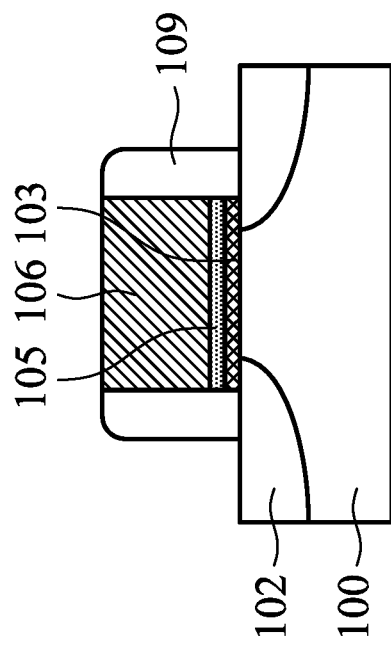

FIGS. 1A-1C show cross sectional views of metal-insulator-semiconductor (MIS) FET-type NCFETs. Although in FIGS. 1A-1C, NCFETs of a planar MOS transistor structure are illustrated, FinFETs and/or gate-all-around (GAA) FETs can be employed.

As shown in FIG. 1A, an MIS NCFET includes a substrate 100, a channel 101 and source and drain 102. The source and drain 102 are appropriately doped with impurities. Further, the source and drain and the channel (active regions) are surrounded by an isolation insulating layer (not shown), such as shallow trench isolation (STI), made of, for example, silicon oxide.

An interfacial layer 103 is formed over the channel layer 101, in some embodiments. The interfacial layer 103 is made of silicon oxide having thickness in a range from about 0.5 nm to about 1.5 nm in some embodiments.

A ferroelectric dielectric layer 105 is disposed over the interfacial layer 103. The ferroelectric dielectric layer 105 includes $HfO_2$ doped with one or more elements selected from the group consisting of Si, Zr, Al, La, Y, Gd, Mg and Sr. In some embodiments, the ferroelectric dielectric layer 105 includes $ZrO_2$ doped with one or more elements selected from the group consisting of Si, Hf, Al, La, Y, Gd, Mg and Sr, or $SrTiO_3$ doped with one or more elements selected from the group consisting of Si, Zr, Al, La, Y, Gd, Mg and/or Hf. In certain embodiments, the ferroelectric dielectric 105 layer includes $HfZrO_2$ doped with one or more elements selected from the group consisting of Si, Al, La, Y, Gd, Mg and Sr. In the present disclosure, the ferroelectric dielectric layer 105 includes an orthorhombic crystal phase. The orthorhombic crystal of the ferroelectric dielectric layer 105 is polycrystalline in some embodiments. The thickness of the ferroelectric dielectric layer 105 is in a range from about 1.0 nm to about 10 nm in some embodiments.

A gate electrode layer 106 is disposed over the ferroelectric dielectric layer 105. The gate electrode layer 106 includes one or more metallic layers. In some embodiments, the gate electrode layer 106 includes a barrier layer disposed on the first conductive layer, a work function adjustment layer disposed on the barrier layer, a glue layer disposed on the work function adjustment layer and a main gate metal layer disposed on the glue layer. One or more of these layers are not formed in some embodiments.

The work function adjustment layer includes one or more layers of conductive material, such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, HfTi, TiSi and TaSi is used as the work function adjustment layer, and for the p-channel FinFET, one or more of TiAlC, Al, TiAl, TaN, TaAlC, TiN, TiC and Co is used as the work function adjustment layer.

The glue layer includes Ti, TiN and/or TaN in some embodiments. The main gate metal layer includes a metal selected from the group consisting of W, Cu, Ti, Al and Co.

Further, sidewall spacers 109 are formed on opposing side faces of the gate structure as shown in FIG. 1A. The sidewall spacers 109 include one or more layers of insulating material, such as silicon oxide, silicon nitride and silicon oxynitride. As shown in FIG. 1A the ferroelectric dielectric layer 105 and the interfacial layer 103 have a "U-shape" in the cross section, having a thin center portion and thick side portions in the vertical direction.

FIG. 1B shows a cross sectional view of a metal-insulator-semiconductor (MIS) FET-type NCFET in accordance with another embodiment. In FIG. 1B, the interfacial layer 103 has a flat shape, and the ferroelectric dielectric layer 105 is conformally formed in the gate space and has a height substantially equal to the height of the gate electrode layer 106. As shown in FIG. 1B, the ferroelectric dielectric layer 105 has a "U-shape" in the cross section, having a thin center portion and thick side portions in the vertical direction. In FIG. 1C, the interfacial layer 103 and the ferroelectric layer 105 have a flat shape.

FIGS. 2A-2H show various stages of manufacturing operations for a negative capacitance structure in accordance with an embodiment of the present disclosure. It is understood that additional operations can be provided before, during, and after the processes shown by FIGS. 2A-2H, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-1C may be employed in the following embodiments, and detailed explanation thereof may be omitted.

As shown in FIG. 2B, a dielectric layer 20 is formed on a substrate 10. In some embodiments, the substrate 10 shown in FIG. 2A is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 10 may include an epitaxial layer (epi-layer), which may be strained for performance enhancement, and/or may include a silicon-on-insulator (SOI) structure.

The dielectric layer 20 includes one selected from $HfO_2$, $ZrO_2$ and $SrTiO_3$ in some embodiments. The dielectric layer 20 is amorphous and paraelectric, and is not doped any of Si, Zr, Al, La, Y, Mg, Gd and/or Sr in some embodiments. The thickness of the dielectric layer 20 is in a range from about 1 nm to about 10 nm in some embodiments.

After the dielectric layer 20 is formed, a first metallic layer 25, as a functionalization layer, is formed on the dielectric layer 20, as shown in FIG. 2C. In some embodiments, the first metallic layer 25 includes one or more selected from the group consisting of Si, Zr, Al, La, Y, Gd, Mg and Sr, when the dielectric layer 20 is $HfO_2$. In other embodiments, the first metallic layer 25 includes one or more selected from the group consisting of Si, Hf, Al, La, Y, Gd, Mg and Sr, when the dielectric layer 20 is $ZrO_2$. In certain embodiments, the first metallic layer 25 is not required, when the dielectric layer 20 is $SrTiO_3$.

The first metallic layer 25 can be formed by ALD, CVD or physical vapor deposition including sputtering or any other suitable methods. When ALD is utilized, the ALD is performed at a temperature in a range from about 25° C. to about 500° C. in some embodiments. The thickness of the first metallic layer 25 is in a range from about 1 nm to about 5 nm in some embodiments.

After the first metallic layer 25 is formed, in some embodiments, a cap layer 30 is formed over the first metallic layer 25, as shown in FIG. 2D. In other embodiments, the cap layer 30 is not formed. The cap layer 30 includes an insulating material, such as silicon oxide, silicon nitride and/or silicon oxynitride in some embodiments. In other embodiments, the cap layer 30 is TiN, TiN doped with Si, amorphous Si or poly silicon or other suitable material. The cap layer 30 can be formed by ALD, CVD or physical vapor deposition including sputtering or any other suitable methods. The thickness of the cap layer 30 is in a range from about 2 nm to about 10 nm in some embodiments.

After the cap layer 30 is formed, or after the first metallic layer 25 is formed when the cap layer 30 is not formed, an annealing operation is performed as shown in FIG. 2E. The annealing operation is performed by using an energy beam 40. The energy beam 40 includes one selected from the group consisting of an electron beam, an ion beam, a molecular beam, a laser light beam, and a neutral beam. The energy beam heats at least the cap layer 30 (if presents), the first metallic layer 25 and the dielectric layer 20 to a temperature in a range from about 700° C. to about 1000° C. In other words, the energy beam has an energy that can heat the first metallic layer 25 and the dielectric layer 20 to a temperature in the range from about 600° C. to about 1000° C.

The dimension of the beam spot of the energy beam can be less than about 1 nm in some embodiments. The energy beam 40 can be swept or scanned over the substrate. By using the energy beam, it is possible to selectively heat (anneal) a desired area of the first metallic layer 25 and the dielectric layer 20. Further, by adjusting a focus point of the energy beam 40 vertically, the energy beam can be scanned conformally along the three dimensional geometry of the underlying structure. The focus point is set to be within the dielectric layer 20 in some embodiments. The annealing is performed in an inert gas ambient, such as $N_2$, Ar and/or He in some embodiments. By the annealing operation using the energy beam, the metallic element in the first metallic layer 25 diffuses into the dielectric layer 20.

After the energy beam is irradiated, the irradiated portion is cooled. By the annealing and cooling operations, the amorphous dielectric layer 20 is converted to a ferroelectric layer 22 as shown in FIG. 2F. The annealing and cooling operations provide a driving force for the doped $HfO_2$ structure to transition from an amorphous phase to an orthorhombic phase having a ferroelectric property.

After the cooling operation, the cap layer 30 (if used) and the first metallic layer 25 (if remaining) are removed as shown in FIG. 2G. In the area where the energy beam is not applied (the area not annealed), the dielectric layer 20 does not change to a ferroelectric layer and remains as an amorphous $HfO_2$ layer. Subsequently, a conductive layer 50 is formed over the ferroelectric layer 22 as shown in FIG. 2H.

Figure 3B:
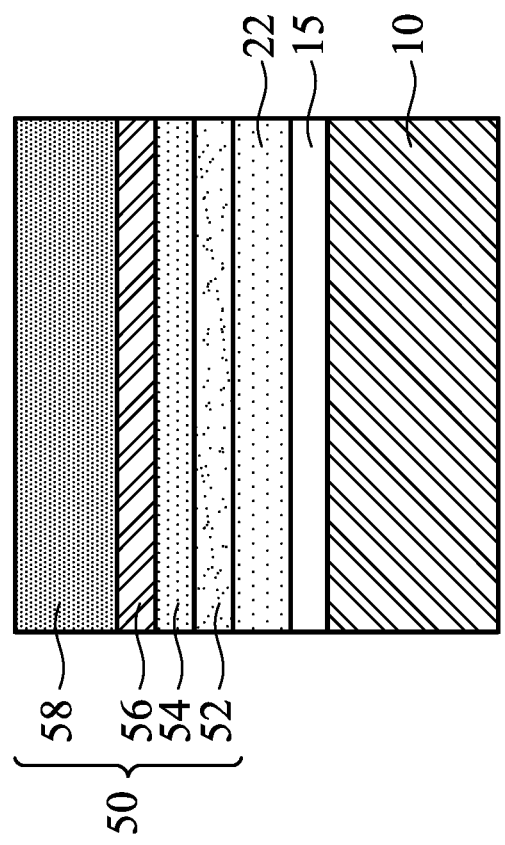
FIGS. 3A and 3B show various show various stages of manufacturing operations for a negative capacitance structure in accordance with other embodiments of the present disclosure.
Figure 3A:
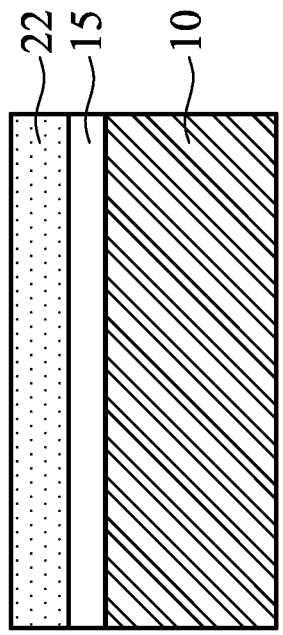

In some embodiments, as shown in FIG. 3A, an interfacial layer 15 is formed between the substrate 10 and the dielectric layer 20. In some embodiments, the interfacial layer 15 is a silicon oxide, which may be formed by chemical reaction. For example, a chemical silicon oxide may be formed using deionized water+ozone ($DIO_3$), $NH_4OH+H_2O_2+H_2O$ (APM), or other methods. Other embodiments may utilize a different material or processes for the interfacial layer. In some embodiments, the interfacial layer 15 has a thickness of about 0.5 nm to about 1.5 nm.

Further, in some embodiments, the conductive layer 50 includes multiple conductive layers, as shown in FIG. 3B. In some embodiments, the conductive layer 50 includes a barrier layer 52 formed over the ferroelectric layer 50, a work function adjustment layer 54 formed on the barrier layer 52, and a main gate metal layer 58.

In some embodiments, the barrier layer 52 is made of, for example, TaN. The barrier layer 52 can be formed by ALD, CVD or physical vapor deposition, including sputtering, or any other suitable methods. When ALD is utilized, the ALD is performed at a temperature in a range from about 300° C. to about 400° C. in some embodiments. The thickness of the barrier layer 52 is in a range from about 1 nm to about 5 nm in some embodiments. In some embodiments, the annealing operation to convert the amorphous structure to the orthorhombic structure may be performed after the barrier layer 52 is formed.

In some embodiments, the work function adjustment layer 54 includes TiN for a p-type transistor and TiAl for an n-type transistor. Any other suitable metallic material can be used as the work function adjustment layer 54. In some embodiments, a TiAl layer is also formed on a TiN work function adjustment layer for a p-type transistor. The work function adjustment layer 54 can be formed by ALD, CVD or physical vapor deposition including sputtering or any other suitable methods. When ALD is utilized, the ALD is performed at a temperature in a range from about 300° C. to about 400° C. in some embodiments. The thickness of the work function adjustment layer 54 is in a range from about 1 nm to about 5 nm in some embodiments.

The main gate metal layer 58 includes one or more metals, such as W, Cu, Ti, Al and Co, or other suitable material. In some embodiments, when the main gate metal layer 58 is W, a glue layer 56 is formed on the work function adjustment layer 54. In some embodiments, the glue layer 56 is Ti. As shown in FIG. 3B, the conductive layer 50 is a gate electrode and may include the barrier layer 52 disposed on the ferroelectric layer 22, the work function adjustment layer 54 disposed on the barrier layer 52, the glue layer 56 disposed on the work function adjustment layer 54 and the main gate metal layer 58. In the area where the energy beam is not applied (the area not annealed), the conductive layer 50 with multiple layers as explained above is formed on the dielectric layer 20, which is an amorphous $HfO_2$ layer.

Figure 4:
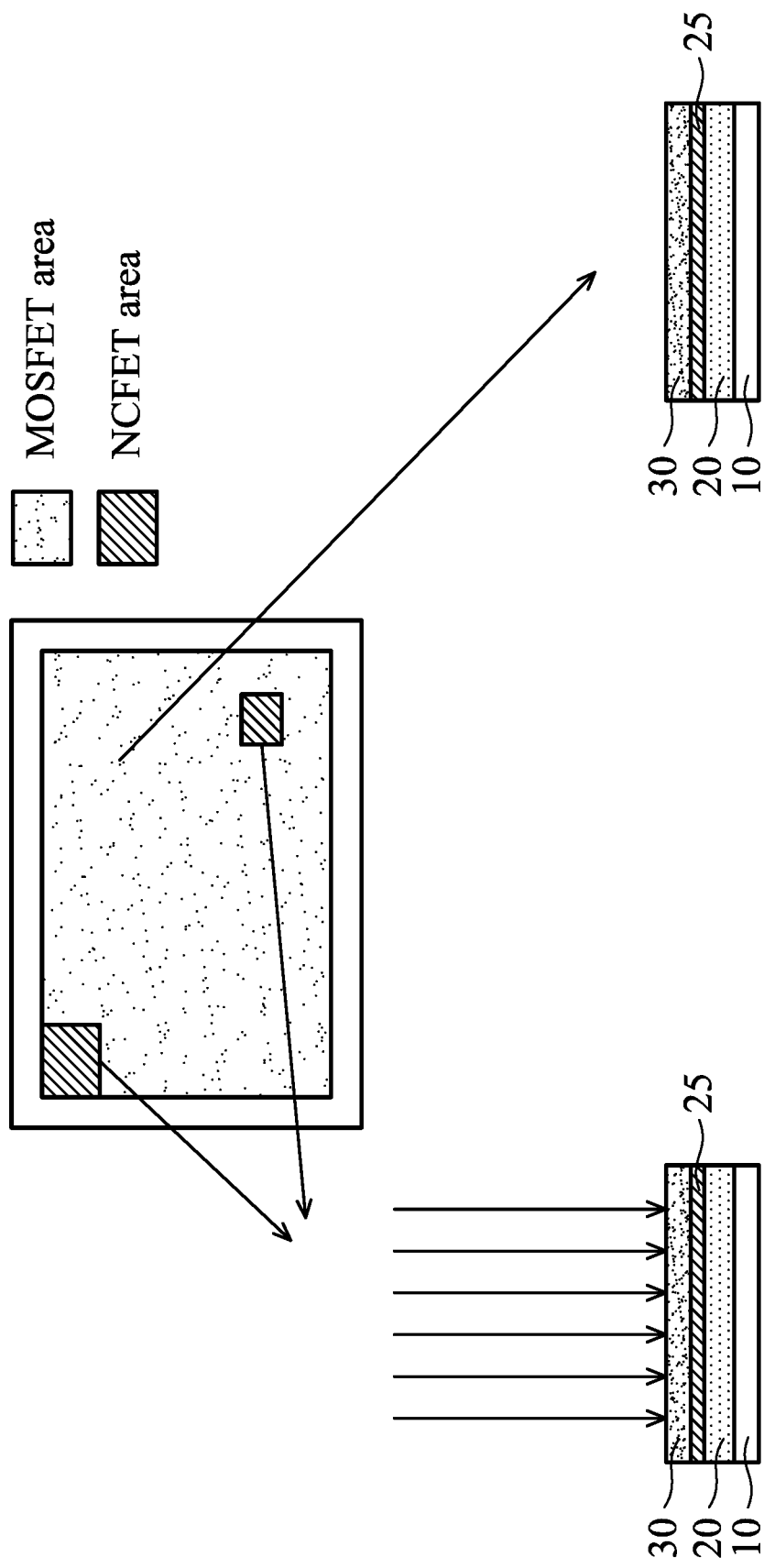
FIG. 4 shows one of the various stages of manufacturing operations for a negative capacitance structure in accordance with an embodiment of the present disclosure.

As set forth above, the annealing operation using the energy beam 40 can be selectively performed on the desired area of the substrate. As shown in FIG. 4, an integrated circuit includes one or more MOSFET areas and one or more NCFET areas. The energy beam 40 is applied only to the NCFET areas to convert the amorphous dielectric layer 20 to the ferroelectric layer 22, while maintaining the amorphous dielectric layer 20 in the MOSFET areas. Accordingly, it is not necessary to from a ferroelectric layer over the entire substrate and remove the ferroelectric layer from the MOSFET areas by using one or more lithography and etching operations, and/or it is not necessary to form a dielectric layer over the entire substrate and remove the dielectric layer from the NCFET areas by using one or more lithography and etching operations.

FIGS. 5A-17C show various stages of manufacturing operations for a circuit including an NCFET and a MOSFET in accordance with an embodiment of the present disclosure. It is understood that additional operations can be provided before, during, and after the processes shown by FIGS. 5A-17C, and some of the operations described below are replaced or eliminated, for additional embodiments of the method. The order of the operations/processes may be interchangeable. Material, configuration, dimensions and/or processes the same as or similar to the foregoing embodiments described with FIGS. 1A-4 may be employed in the following embodiments, and detailed explanation thereof may be omitted.

In the following embodiments, the manufacturing operations shown by FIGS. 5A to 12D are common to the NCFET and the MOSFET.

Figure 5B:
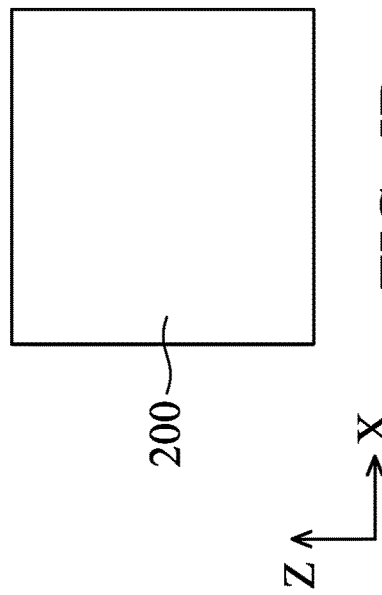
FIGS. 5A and 5B show one of the various stages of manufacturing operations for an NCFET in accordance with an embodiment of the present disclosure.
Figure 5A:
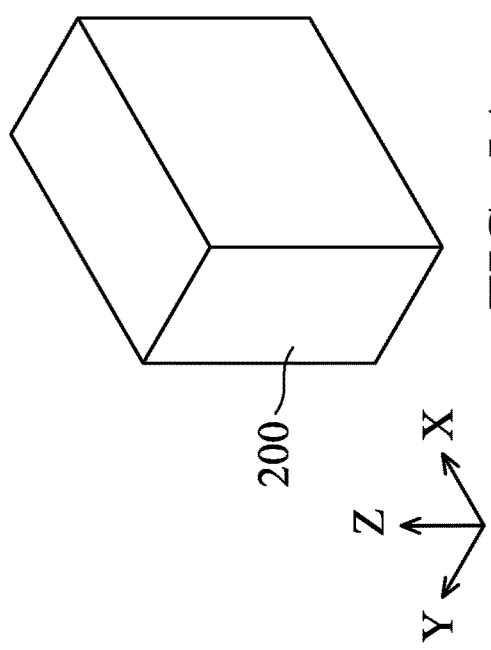

FIG. 5A shows a perspective view and FIG. 5B is a cross sectional view along the X direction, showing one of various stages of the manufacturing operation according to an embodiment of the present disclosure. As shown in FIGS. 5A and 5B, a substrate 200 is provided. In some embodiments, the substrate 200 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 200 may include an epitaxial layer (epi-layer), which may be strained for performance enhancement, and/or may include a silicon-on-insulator (SOI) structure. The upper portion of the substrate 200 can be multi-layers of Si and SiGe.

Figure 6B:
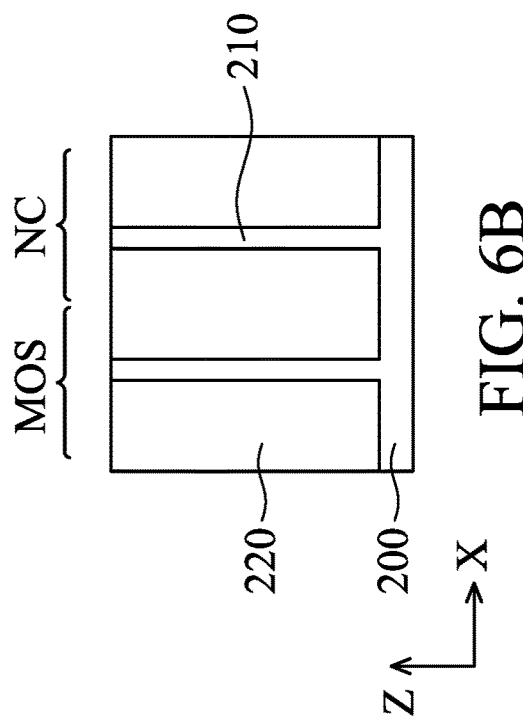
FIGS. 6A and 6B show one of the various stages of manufacturing operations for an NCFET in accordance with an embodiment of the present disclosure.
Figure 6A:
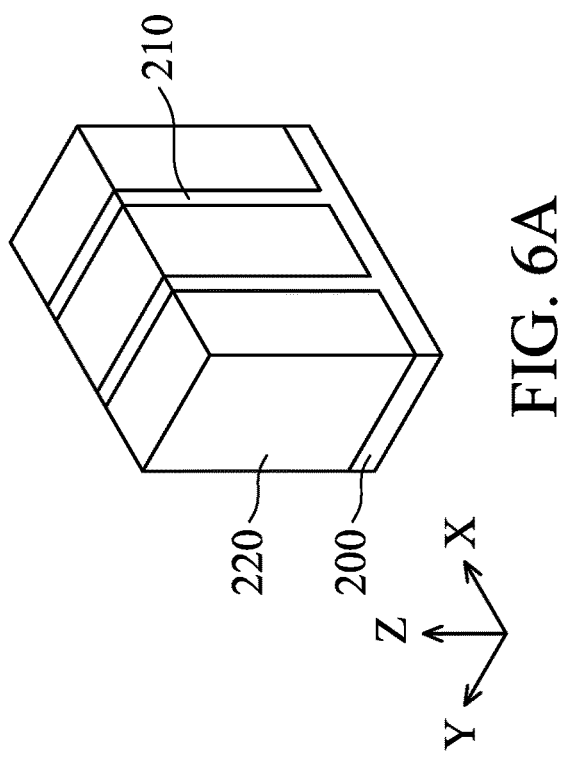

FIG. 6A shows a perspective view and FIG. 6B is a cross sectional view along the X direction, showing one of various stages of the manufacturing operation according to an embodiment of the present disclosure. As shown in FIGS. 6A and 6B, fin structures 210 are formed by etching the substrate 200 and forming an isolation insulating layer 220. The fin structures 210 may be patterned by any suitable method. For example, the fin structures 210 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures 210. In some embodiments, the width of the fin structures 210 is in a range from about 4 nm to about 10 nm and the pitch of the fin structures 210 is in a range from about 10 nm to about 50 nm.

Then, an insulating material layer 220 is formed over the fin structures, thereby embedding the fin structures. The insulating material layer 220 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the insulating material layer 220 is formed through a process such as CVD, flowable CVD (FCVD), or a spin-on-glass process, although any acceptable process may be utilized. Subsequently, portions of the insulating material layer 220 extending over the top surfaces of the fin structures 210 are removed using, for example, an etch process, chemical mechanical polishing (CMP), or the like, as shown in FIGS. 6A and 6B.

Figure 7A:
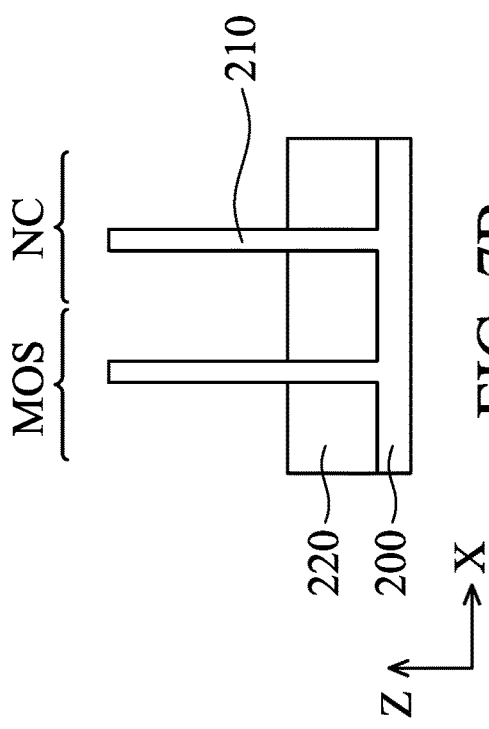
FIGS. 7A and 7B show one of the various stages of manufacturing operations for an NCFET in accordance with an embodiment of the present disclosure.
Figure 7B:
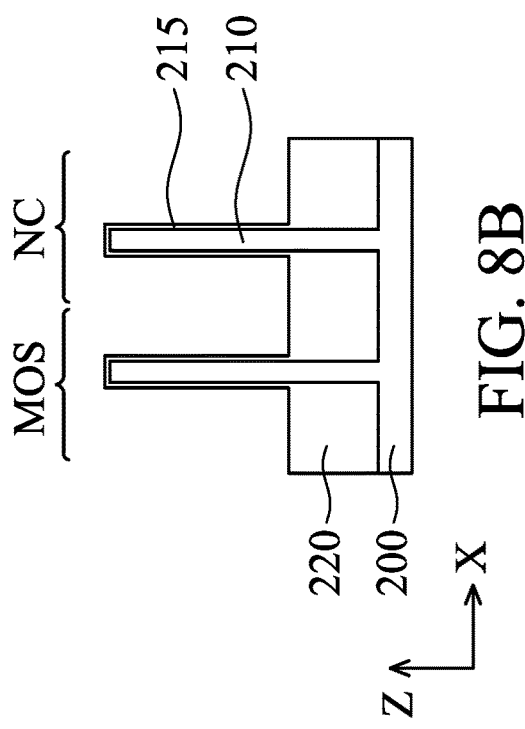

FIG. 7A shows a perspective view and FIG. 7B is a cross sectional view along the X direction, showing one of various stages of the manufacturing operation according to an embodiment of the present disclosure. In some embodiments, one of the fin structures 210 is disposed in a MOSFET area MOS and the other of the fin structures 210 is disposed in an NCFET area NC as shown in FIG. 7B. Further, as shown in FIGS. 7A and 7B, the insulating material layer 220 is recessed so that the upper portions of the fin structures 210 are exposed. The recessed insulating material layer 220 is called an isolation insulating layer or a shallow trench isolation (STI). The height of the exposed fin structures 210 measured from the upper surface of the isolation insulating layer 220 is in a range about 30 nm to about 100 nm in some embodiments.

Figure 8A:
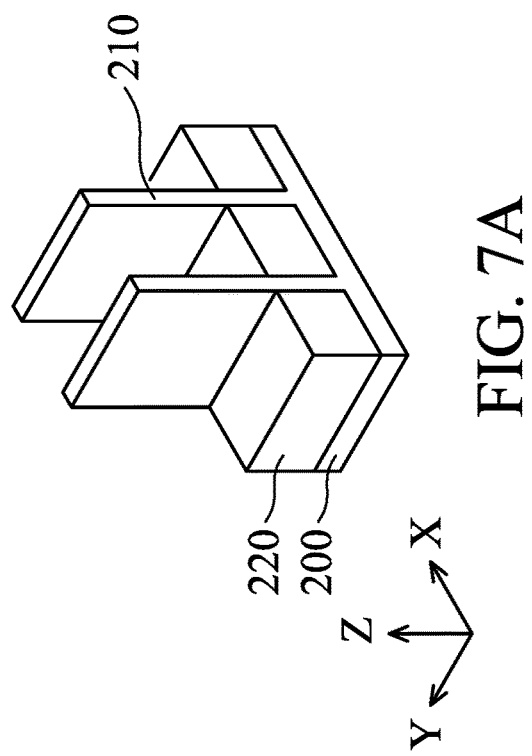
FIGS. 8A and 8B show one of the various stages of manufacturing operations for an NCFET in accordance with an embodiment of the present disclosure.
Figure 8B:
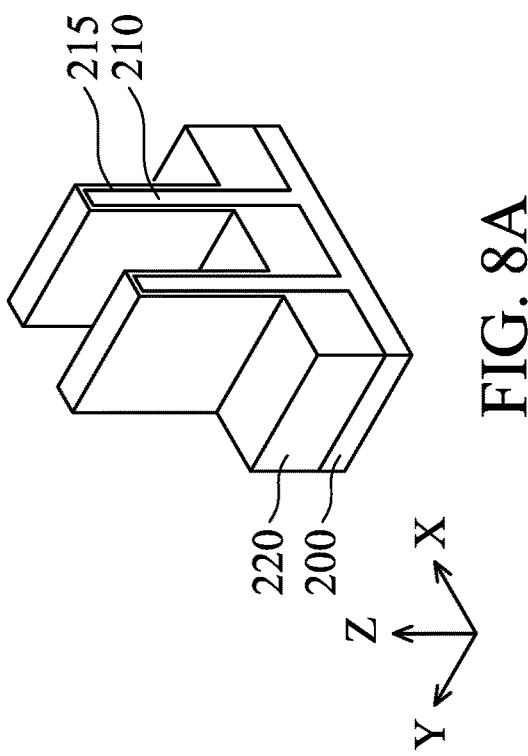

FIG. 8A shows a perspective view and FIG. 8B is a cross sectional view along the X direction, showing one of various stages of the manufacturing operation according to an embodiment of the present disclosure. Subsequently, a dummy gate dielectric layer 215 is formed over the upper portions of the fin structure 210, as shown in FIGS. 8A and 8B. The dummy gate dielectric layer 215 is a silicon oxide layer formed by CVD or ALD, in some embodiments. The thickness of the dummy gate dielectric layer 215 is in a range from about 1 nm to about 3 nm in some embodiments.

Then, a polysilicon layer 230 is formed over the dummy gate electrode layer 215, and further a hard mask layer is formed on the polysilicon layer. The hard mask layer is patterned into a hard mask pattern 235 by suitable lithography and etching operations, as shown in FIGS. 9A-9C. The hard mask pattern 235 includes one or more layers of insulating material, such as silicon oxide and silicon nitride, in some embodiments.

FIG. 9A shows a perspective view, FIG. 9B is a cross sectional view along the Y direction in the NCFET area NC, and FIG. 9C is a cross sectional view along the X direction, showing one of various stages of the manufacturing operation according to an embodiment of the present disclosure. By using the hard mask pattern 235 as an etching mask, the polysilicon layer is patterned into dummy gate electrodes 230, as shown in FIGS. 9A-9C. In some embodiments, the width of the dummy gate electrode 230 is in a range from about 8 nm to about 20 nm.

FIG. 10A shows a perspective view, FIG. 10B is a cross sectional view along the Y direction in the NCFET area NC, and FIG. 10C is a cross sectional view along the X direction, showing one of various stages of the manufacturing operation according to an embodiment of the present disclosure. Sidewall spacers 240 are formed on opposing side faces of the dummy gate electrodes 230. The sidewall spacers 240 include one or more layers of insulating material, such as silicon oxide, silicon nitride and silicon oxynitride. Moreover, source/drain epitaxial layers 250 are formed over source/drain regions of the fin structures 210. The source/drain epitaxial layer 250 includes SiP, SiAs, SiGeP, SiGeAs, GeP, GeAs, and/or SiGeSn or other suitable material for an n-type FET, and SiB, SiGa, SiGeB, SiGeGa, GeB, GeGa and/or SiGeSn or other suitable material for a p-type FET. The thickness of the source/drain epitaxial layers 250 is in a range from about 3 nm to about 8 nm in some embodiments. In some embodiments, an alloy layer, such as a silicide layer, is formed over the source/drain epitaxial layers 250.

FIG. 11A shows a perspective view, FIG. 11B is a cross sectional view along the Y direction in the NCFET area NC, and FIG. 11C is a cross sectional view along the X direction, showing one of various stages of the manufacturing operation according to an embodiment of the present disclosure. Subsequently, a contact etch stop layer (CESL) 245 and an interlayer dielectric layer 260 are formed, and a planarization operation, such as a CMP operation, is performed to exposed upper surfaces of the dummy gate electrodes 230, as shown in FIGS. 11A-11C.

In some embodiments, the CESL layer 245 is made of a silicon nitride based material, such as s and SiON, and the interlayer dielectric layer 260 is made of a silicon oxide based material, such as SiO$_2$ or a low-k material. In some embodiments, an annealing operation is performed after the interlayer dielectric layer is formed.

FIGS. 12A-12D show cross sectional views along the Y direction, showing various stages of the manufacturing operation according to an embodiment of the present disclosure.

After the dummy gate structure is formed as shown in FIG. 12A, the dummy gate electrodes 230 and the dummy gate dielectric layer 215 are removed by using dry and/or wet etching, thereby forming gate spaces 265, as shown in FIG. 12B.

Further, in the gate spaces 265, an interfacial layer 271 and a dielectric layer 120 are formed as shown in FIG. 12C. The dielectric layer 120 is the same as or similar to the dielectric layer 20 shown in FIG. 2B, and the interfacial layer 271 is the same as or similar to the interfacial layer 15 shown in FIG. 3B. Subsequently, a functionalization layer 125 is formed on the dielectric layer 120, as shown in FIG. 12D. The functionalization layer 125 is the same as or similar to the first metallic layer 25 shown in FIG. 2C.

FIGS. 13A-13D show cross sectional views along the Y direction, showing various stages of the manufacturing operation for the NCFET area, while FIGS. 14A-14D show cross sectional views along the Y direction, showing various stages of the manufacturing operation for the MOSFET area. Then, as shown in FIGS. 13A and 14A, a cap layer 130 is optionally formed on the functionalization layer 125. The cap layer 130 is the same as or similar to the cap layer 30 shown in FIG. 2D.

Subsequently, for the NCFET area, the energy beam 140 is applied to at least the dielectric layer 120 to anneal at least the dielectric layer 120, as shown in FIG. 13B. In some embodiments, the energy beam 140 is focused on the bottom portion of the dielectric layer 120 to partially anneal the dielectric layer 120 formed over the channel layer, as shown in FIG. 13B. The operations using the energy beam 140 is the same as or similar to the operation using the energy beam 40 shown in FIG. 2E. In contrast, as shown in FIG. 14B, no annealing operation using the energy beam 140 is performed on the MOSFET area.

After cooling, as shown in FIG. 13C, at least the bottom portion of the dielectric layer 120 is converted to a ferroelectric layer 270 in the NCFET area, while the dielectric layer 120 in the MOSFET area remains amorphous, as shown in FIG. 14C. Further, as shown in FIGS. 13D and 14D, the cap layer 130 and the functionalization layer 125 are removed.

Figures 15A, 15B, 15C, 15D, 15E:
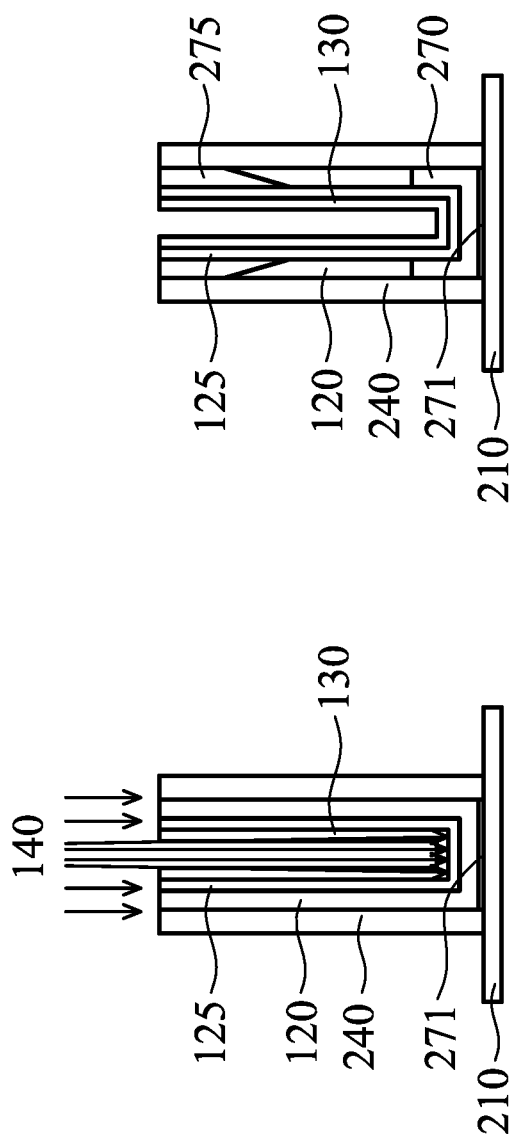
FIGS. 15A, 15B, 15C, 15D and 15E show various stages of manufacturing operations for a NCFET in accordance with other embodiments of the present disclosure.

In other embodiments, the energy beam 140 is applied (focused on) not only to the bottom portion of the dielectric layer 120 but also sidewall portions of the dielectric layer 120 as shown in FIG. 15A. In such a case, a part of the sidewall portions of the dielectric layer 120 is converted to a ferroelectric layer 275 as shown in FIG. 15B. After the cap layer 130 and the functionalization layer 125 are removed, the dielectric structure having an amorphous portion 120 and ferroelectric portions 270, 275 is formed, as shown in FIG. 15C.

In certain embodiments, the dielectric layer 120 in the NCFET area is fully converted to the ferroelectric layer 270, as shown in FIGS. 15D and 15E.

Figures 16A, 16B, 16C:
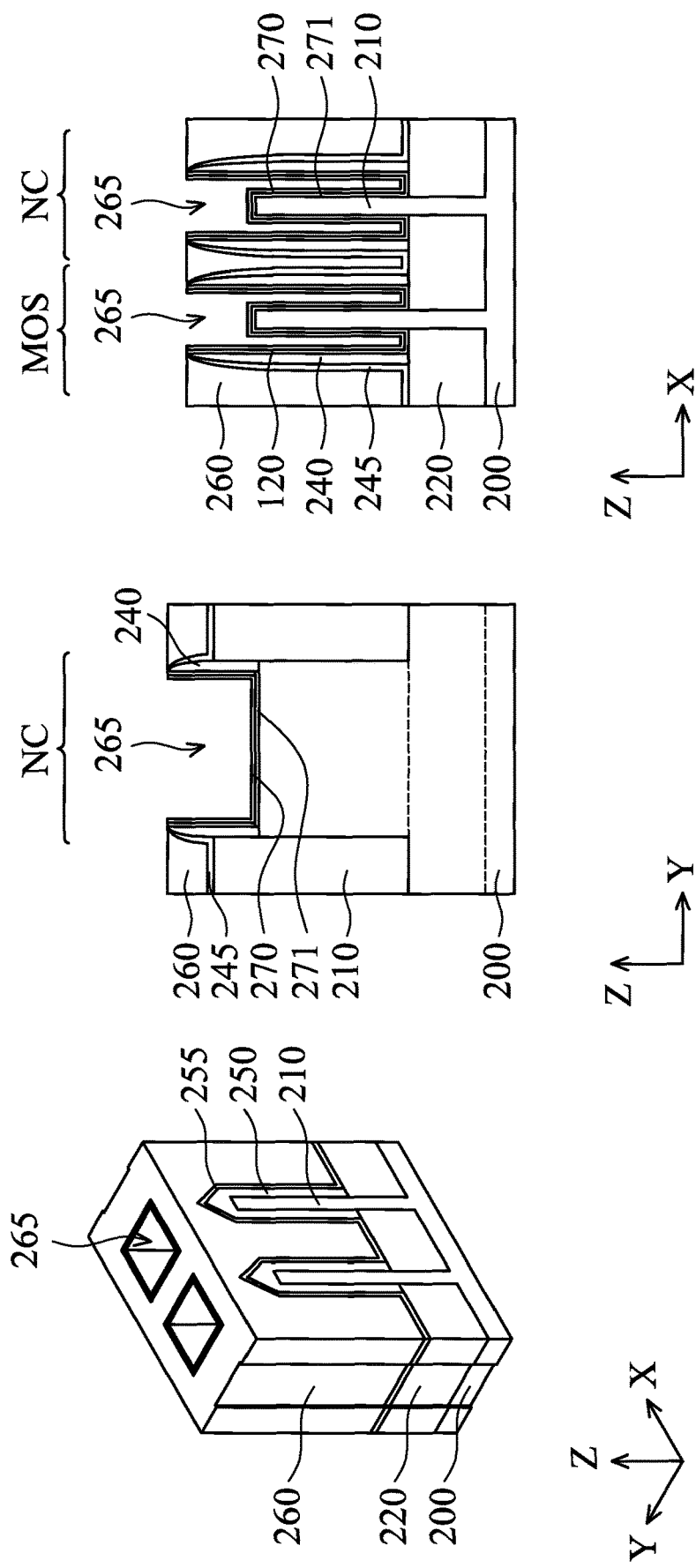
FIGS. 16A, 16B and 16C show one of the various stages of manufacturing operations for an NCFET in accordance with an embodiment of the present disclosure.

FIG. 16A shows a perspective view, FIG. 16B is a cross sectional view along the Y direction and FIG. 16C is a cross sectional view along the X direction, showing one of various stages of the manufacturing operation according to an embodiment of the present disclosure. FIGS. 16A-16C show the structure after the ferroelectric layer 270 (or the ferroelectric layer 275 as shown in FIGS. 15C and 15E) is formed.

Figures 17A, 17B, 17C:
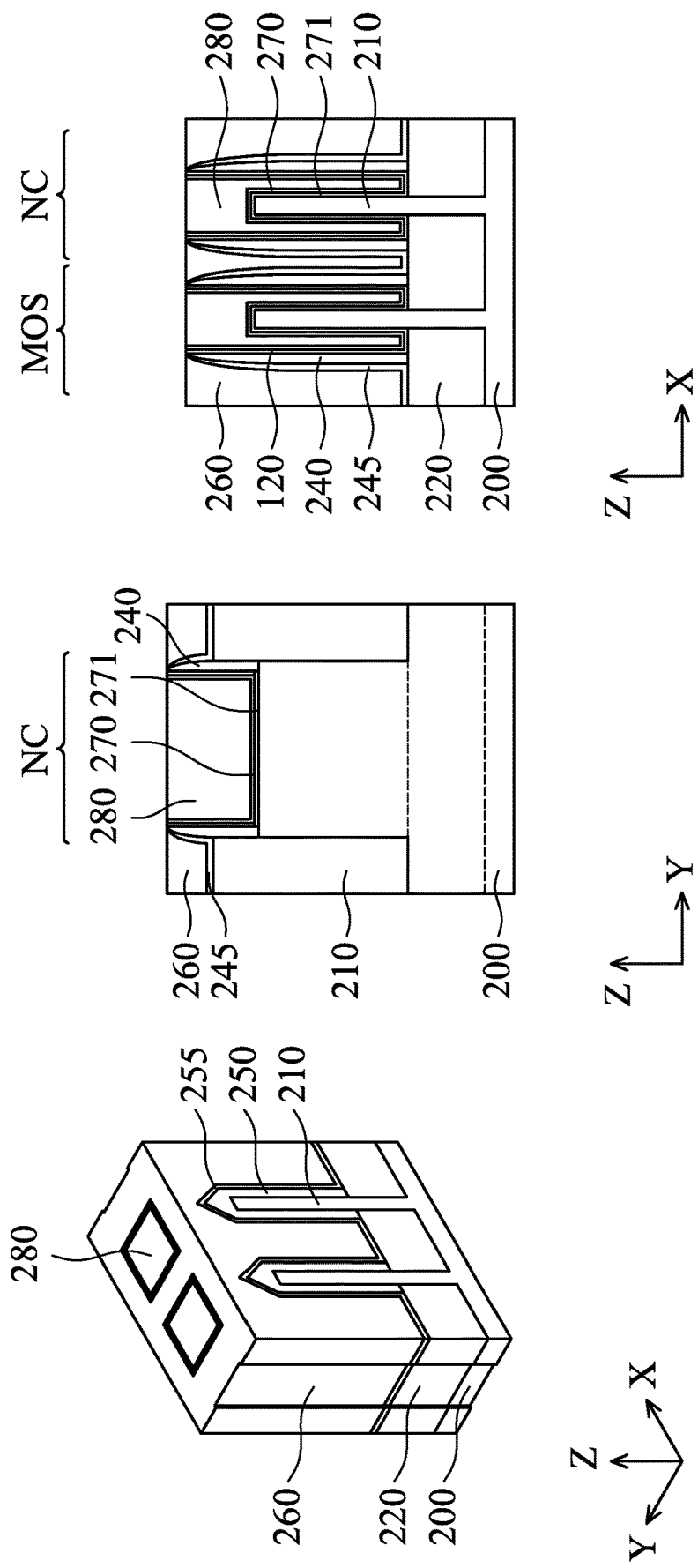
FIGS. 17A, 17B and 17C show one of the various stages of manufacturing operations for an NCFET in accordance with an embodiment of the present disclosure.

Further, a gate electrode 280 is formed, as shown in FIGS. 17A-17C. The gate electrode 280 is the same as or similar to the conductive layer 50 shown in FIGS. 2H and/or 3B. After the conductive materials for the gate electrode are formed, a planarization operation, such as CMP, is performed to remove excess materials above the interlayer dielectric layer 260. As set forth above, in some embodiments, the dielectric structure having an amorphous portion 120 and ferroelectric portions 270 is disposed between the gate electrode and the sidewall spacers.

After forming the gate structures, further CMOS processes are performed to form various features such as additional interlayer dielectric layers, contacts/vias, interconnect metal layers, and passivation layers, etc.

It will be understood that not all advantages have been necessarily discussed herein, no particular advantage is required for all embodiments or examples, and other embodiments or examples may offer different advantages.

For example, in the present disclosure, by using an energy beam on the functionalization layer including a metallic element, the dielectric layer (e.g., HfO$_2$) can be selectively converted to a ferroelectric layer. Accordingly, it is not necessary to from a ferroelectric layer over the entire substrate and remove the ferroelectric layer from the MOSFET areas by using one or more lithography and etching operations, and/or it is not necessary to from a dielectric layer over the entire substrate and remove the dielectric layer from the NCFET areas by using one or more lithography and etching operations. Thus, a semiconductor integrated circuit having NCFETs and MOSFETs can be easily manufactured.

In accordance with an aspect of the present disclosure, in a method of manufacturing a negative capacitance structure, a dielectric layer is formed over a substrate. A first metallic layer is formed over the dielectric layer. After the first metallic layer is formed, an annealing operation is performed. The annealing operation includes irradiating the first metallic layer and the dielectric layer with an energy beam, and after the annealing operation, the dielectric layer becomes a ferroelectric dielectric layer including an orthorhombic crystal phase. In one or more of the foregoing or following embodiments, the dielectric layer includes one selected from the group consisting of $HfO_2$, $ZrO_2$ and $SrTiO_3$. In one or more of the foregoing or following embodiments, the dielectric layer before the first metallic layer is formed is a non-doped amorphous layer. In one or more of the foregoing or following embodiments, the dielectric layer includes $HfO_2$, and the first metallic layer includes one or more selected from the group consisting of Si, Zr, Al, La, Y, Gd, Mg and Sr. In one or more of the foregoing or following embodiments, the energy beam heats the first metallic layer and the dielectric layer to a temperature in a range from 600° C. to 1000° C. In one or more of the foregoing or following embodiments, after the annealing operation, the first metallic layer is removed. In one or more of the foregoing or following embodiments, before the annealing operation, a cap layer is formed over the first metallic layer. In one or more of the foregoing or following embodiments, the cap layer includes silicon oxide. In one or more of the foregoing or following embodiments, after the annealing operation, the cap layer and the first metallic layer are removed. In one or more of the foregoing or following embodiments, the energy beam includes one selected from the group consisting of an electron beam, an ion beam, a molecular beam, a laser light beam, and a neutral beam.

In accordance with another aspect of the present disclosure, in a method of manufacturing a circuit, the circuit includes a metal-oxide-semiconductor field effect transistor (MOSFET) disposed in a MOSFET region and a negative capacitance field effect transistor (NCFET) disposed in a NCFET region. In the method, a dielectric layer is formed over a channel layer in the MOSFET region and the NCFET region. A first metallic layer is formed over the dielectric layer in the MOSFET region and the NCFET region. After the first metallic layer is formed, an annealing operation is performed only in the NCFET region. After the annealing operation, the first metallic layer is removed from in the MOSFET region and the NCFET region. The annealing operation includes irradiating the first metallic layer and the dielectric layer in the NCFET region with an energy beam, and after the annealing operation, the dielectric layer becomes a ferroelectric dielectric layer including an orthorhombic crystal phase in the NCFET region. In one or more of the foregoing or following embodiments, the dielectric layer as formed includes amorphous $HfO_2$. In one or more of the foregoing or following embodiments, the first metallic layer includes one or more selected from the group consisting of Si, Zr, Al, La, Y, Gd, Mg and Sr. In one or more of the foregoing or following embodiments, before the annealing operation, a cap layer is formed over the first metallic layer in the MOSFET region and the NCFET region. In one or more of the foregoing or following embodiments, the cap layer includes silicon oxide. In one or more of the foregoing or following embodiments, after the annealing operation, the cap layer and the first metallic layer are removed from the MOSFET region and the NCFET region. In one or more of the foregoing or following embodiments, the energy beam includes one selected from the group consisting of an electron beam, an ion beam, a molecular beam, a laser light beam, and a neutral beam having an energy to heat the first metallic layer and the dielectric layer to a temperature in a range from 700° C. to 1000° C.

In accordance with another aspect of the present disclosure, in a method of manufacturing a circuit, the circuit includes a metal-oxide-semiconductor field effect transistor (MOSFET) disposed in a MOSFET region and a negative capacitance field effect transistor (NCFET) disposed in a NCFET region. In the method, a first dummy gate structure is formed over a first fin structure formed in the MOSFET region and a second dummy gate structure is formed over a second fin structure formed in the NCFET region. A first source/drain structure is formed over the first fin structure on opposing sides of the first dummy gate structure and a second source/drain structure is formed over the second fin structure on opposing sides of the second dummy gate structure. An interlayer dielectric layer is formed over the first and second source/drain structures. The first dummy gate structure and the second dummy gate structure are removed, thereby exposing a first channel region of the first fin structure and a second channel region of the first fin structure. A dielectric layer is formed over the first and second channel regions. A first metallic layer is formed over the dielectric layer. After the first metallic layer is formed, an annealing operation is performed only in the NCFET region. After the annealing operation, the first metallic layer is removed from in the MOSFET region and the NCFET region. The annealing operation includes irradiating the first metallic layer and the dielectric layer in the NCFET region with an energy beam, and after the annealing operation, the dielectric layer becomes a ferroelectric layer including an orthorhombic crystal phase in the NCFET region. In one or more of the foregoing or following embodiments, one or more second metallic layers are formed over the dielectric layer in the MOSFET region and over the ferroelectric layer in the NCFET region. In one or more of the foregoing or following embodiments, the dielectric layer in the MOSFET region after the first metallic layer is removed includes amorphous $HfO_2$, and the ferroelectric layer in the NCFET region includes $HfO_2$ doped with one or more selected from the group consisting of Si, Zr, Al, La, Y, Gd, Mg and Sr.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a negative capacitance structure, the method comprising:
    forming sidewall spacers at opposite ends of a gate region on top of a fin;
    forming a dielectric layer over the fin in the gate region between the sidewall spacers and on the sidewall spacers;
    forming a first metallic layer over the dielectric layer;
    forming a cap layer over the first metallic layer;
    after the cap layer is formed, performing an annealing operation; and
    after the annealing operation, removing the cap layer and the first metallic layer; and
    wherein the annealing operation includes irradiating the cap layer, the first metallic layer, and the dielectric layer in the gate region between the sidewall spacers and on upper parts of the sidewall spacers with an energy beam, and after the annealing operation, the dielectric layer in the gate region between the sidewall spacers and on the upper parts of the sidewall spacers becomes a ferroelectric dielectric layer including an orthorhombic crystal phase.

2. The method of claim 1, wherein the dielectric layer includes one selected from the group consisting of $HfO_2$, $ZrO_2$ and $SrTiO_3$.

3. The method of claim 1, wherein:
the dielectric layer includes $HfO_2$, and
the first metallic layer includes one or more selected from the group consisting of Si, Zr, Al, La, Y, Gd, Mg and Sr.

4. The method of claim 1, wherein the energy beam heats the first metallic layer and the dielectric layer to a temperature in a range from 600° C. to 1000° C.

5. The method of claim 1, further comprising, after the annealing operation, removing the first metallic layer.

6. The method of claim 1, wherein the ferroelectric dielectric layer has a U-shape.

7. The method of claim 1, wherein the cap layer includes silicon oxide, silicon nitride, silicon oxynitride, or a combination thereof.

8. The method of claim 1, further comprising, after the removing the cap layer and the first metallic layer, forming one or more second metallic layers over the dielectric layer.

9. A method of manufacturing a circuit including a metal-oxide-semiconductor field effect transistor (MOSFET) disposed in a MOSFET region and a negative capacitance field effect transistor (NCFET) disposed in a NCFET region, the method comprising:

forming sidewall spacers at opposite ends of gate regions on top of fins in the MOSFET and NCFET regions;

forming a dielectric layer over the fins in the gate regions of the NCFET and MOSFET regions between the sidewall spacers and on the sidewall spacers;

forming a first metallic layer over the dielectric layer in the MOSFET region and the NCFET region;

after the first metallic layer is formed, performing an annealing operation only in the NCFET region; and after the annealing operation, removing the first metallic layer from the MOSFET region and the NCFET region, wherein the annealing operation includes irradiating the first metallic layer and the dielectric layer in the NCFET region between the sidewall spacers and on upper parts of the sidewall spacers in the NCFET region with an energy beam, and after the annealing operation, in the NCFET region, the dielectric layer in the gate region between the sidewall spacers and on the upper parts of the sidewall spacers becomes a ferroelectric dielectric layer including an orthorhombic crystal phase.

10. The method of claim 9, wherein the dielectric layer includes amorphous $HfO_2$.

11. The method of claim 10, wherein the first metallic layer includes one or more selected from the group consisting of Si, Zr, Al, La, Y, Gd, Mg and Sr.

12. The method of claim 10, wherein the energy beam includes one selected from the group consisting of an electron beam, an ion beam, a molecular beam, a laser light beam, and a neutral beam having an energy to heat the first metallic layer and the dielectric layer to a temperature in a range from 600° C. to 1000° C.

13. The method of claim 9, further comprising, before the annealing operation, forming a cap layer over the first metallic layer in the MOSFET region and the NCFET region.

14. The method of claim 13, wherein the cap layer includes silicon oxide.

15. The method of claim 13, further comprising, after the annealing operation, removing the cap layer and the first metallic layer from the MOSFET region and the NCFET region.

16. A method of manufacturing a circuit including a metal-oxide-semiconductor field effect transistor (MOSFET) disposed in a MOSFET region and a negative capacitance field effect transistor (NCFET) disposed in a NCFET region, the method comprising:

forming a first dummy gate structure over a first fin structure formed in the MOSFET region on a substrate and a second dummy gate structure over a second fin structure formed in the NCFET region on the substrate;

forming a first source/drain structure over the first fin structure on opposing sides of the first dummy gate structure and a second source/drain structure over the second fin structure on opposing sides of the second dummy gate structure;

forming an interlayer dielectric layer over the first and second source/drain structures;

removing the first dummy gate structure and the second dummy gate structure, thereby exposing a first channel region of the first fin structure and a second channel region of the first fin structure;

forming sidewall spacers at opposite ends of the first and second channel regions on top of the first and second fin structures in the MOSFET and NCFET regions;

forming a dielectric layer over the first and second fin structures in the NCFET and MOSFET regions between the sidewall spacers, over sidewalls of the first and second fin structures in the first and second channel regions from a top of the first and second channel regions to the substrate, and on the sidewall spacers;

forming a first metallic layer over the dielectric layer in the MOSFET region and the NCFET region;

after the first metallic layer is formed, performing an annealing operation only in the NCFET region; and after the annealing operation, removing the first metallic layer from the MOSFET region and the NCFET region, wherein the annealing operation includes irradiating, in the NCFET region, the first metallic layer and the dielectric layer between the sidewall spacers and the sidewalls of the second fin structure in the second channel region with an energy beam and irradiating the first metallic layer and the dielectric layer on the sidewall spacers of the NCFET region with the energy beam, and after the annealing operation, in the NCFET region, the dielectric layer over the second fin structure, on the sidewalls of the second fin structure, and on the of the sidewall spacers of the NCFET region becomes a ferroelectric layer including an orthorhombic crystal phase.

17. The method of claim 16, further comprising forming one or more second metallic layers over the dielectric layer in the MOSFET region and over the ferroelectric layer in the NCFET region.

18. The method of claim 16, wherein:
the dielectric layer in the MOSFET region after the first metallic layer is removed includes amorphous $HfO_2$, and the ferroelectric layer in the NCFET region includes $HfO_2$ doped with one or more selected from the group consisting of Si, Zr, Al, La, Y, Gd, Mg and Sr.

19. The method of claim 16, wherein the energy beam includes one selected from the group consisting of an electron beam, an ion beam, a molecular beam, a laser light beam, and a neutral beam.

20. The method of claim 16, wherein the sidewall spacers include one or more layers comprising silicon oxide, silicon nitride, or silicon oxynitride.

* * * * *